(12) United States Patent
Chien et al.

(10) Patent No.: US 8,647,941 B2
(45) Date of Patent: Feb. 11, 2014

(54) METHOD OF FORMING SEMICONDUCTOR DEVICE

(75) Inventors: Chin-Cheng Chien, Tainan (TW); Chun-Yuan Wu, Yun-Lin County (TW); Chih-Chien Liu, Taipei (TW); Chin-Fu Lin, Tainan (TW); Teng-Chun Tsai, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 352 days.

(21) Appl. No.: 13/211,319

(22) Filed: Aug. 17, 2011

(65) Prior Publication Data
US 2013/0045579 A1 Feb. 21, 2013

(51) Int. Cl.
*H01L 21/8238* (2006.01)

(52) U.S. Cl.
USPC .......... 438/222; 438/196; 438/218; 438/938; 257/E21.461

(58) Field of Classification Search
USPC ......... 438/196, 218, 212, 938, 301, 303, 285, 438/299; 257/192, 347, E21.207, E21.411, 257/E21.461
See application file for complete search history.

(56) References Cited

U.S. PATENT DOCUMENTS

| 4,891,303 | A | 1/1990 | Garza |
|---|---|---|---|
| 5,217,910 | A | 6/1993 | Shimizu |
| 5,273,930 | A | 12/1993 | Steele |
| 5,356,830 | A | 10/1994 | Yoshikawa |
| 5,372,957 | A | 12/1994 | Liang |
| 5,385,630 | A | 1/1995 | Philipossian |
| 5,399,506 | A | 3/1995 | Tsukamoto |
| 5,447,884 | A | 9/1995 | Fahey |
| 5,625,217 | A | 4/1997 | Chau |
| 5,777,364 | A | 7/1998 | Crabbe |
| 5,783,478 | A | 7/1998 | Chau |
| 5,783,479 | A | 7/1998 | Lin |
| 5,960,322 | A | 9/1999 | Xiang |
| 6,030,874 | A | 2/2000 | Grider |
| 6,048,756 | A | 4/2000 | Lee |
| 6,074,954 | A | 6/2000 | Lill |
| 6,100,171 | A | 8/2000 | Ishida |
| 6,110,787 | A | 8/2000 | Chan |
| 6,165,826 | A | 12/2000 | Chau |
| 6,165,881 | A | 12/2000 | Tao |
| 6,191,052 | B1 | 2/2001 | Wang |
| 6,228,730 | B1 | 5/2001 | Chen |
| 6,245,626 | B1 | 6/2001 | Chen |
| 6,274,447 | B1 | 8/2001 | Takasou |
| 6,355,533 | B2 | 3/2002 | Lee |
| 6,365,476 | B1 | 4/2002 | Talwar |
| 6,368,926 | B1 | 4/2002 | Wu |
| 6,444,591 | B1 | 9/2002 | Schuegraf |
| 6,537,370 | B1 | 3/2003 | Hernandez |
| 6,544,822 | B2 | 4/2003 | Kim |
| 6,605,498 | B1 | 8/2003 | Murthy |
| 6,613,695 | B2 | 9/2003 | Pomarede |

(Continued)

*Primary Examiner* — Jarrett Stark
(74) *Attorney, Agent, or Firm* — Winston Hsu; Scott Margo

(57) ABSTRACT

A method of forming a semiconductor device includes the following steps. A semiconductor substrate having a first strained silicon layer is provided. Then, an insulating region such as a shallow trench isolation (STI) is formed, where a depth of the insulating region is substantially larger than a depth of the first strained silicon layer. Subsequently, the first strained silicon layer is removed, and a second strained silicon layer is formed to substitute the first strained silicon layer.

15 Claims, 3 Drawing Sheets

(56) References Cited

U.S. PATENT DOCUMENTS

| | | |
|---|---|---|
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,652,718 B1 | 11/2003 | D'Couto |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,118,987 B2 | 10/2006 | Fu |
| 7,119,404 B2 | 10/2006 | Chang |
| 7,132,338 B2 | 11/2006 | Samoilov |
| 7,138,323 B2 | 11/2006 | Kavalieros |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,271,464 B2 | 9/2007 | Trivedi |
| 7,288,822 B1 | 10/2007 | Ting |
| 7,303,999 B1 | 12/2007 | Sriraman |
| 7,314,793 B2 | 1/2008 | Frohberg |
| 7,335,959 B2 | 2/2008 | Curello |
| 7,396,728 B2 | 7/2008 | Varghese |
| 7,410,859 B1 | 8/2008 | Peidous |
| 7,456,067 B2 | 11/2008 | Ang |
| 7,462,239 B2 | 12/2008 | Brabant |
| 7,482,245 B1 | 1/2009 | Yu |
| 7,491,615 B2 | 2/2009 | Wu |
| 7,494,856 B2 | 2/2009 | Zhang |
| 7,494,858 B2 | 2/2009 | Bohr |
| 7,498,214 B2 * | 3/2009 | Jung .................... 438/197 |
| 7,517,816 B2 | 4/2009 | Frohberg |
| 7,550,336 B2 | 6/2009 | Hsiao |
| 7,560,326 B2 * | 7/2009 | Mocuta et al. ............ 438/197 |
| 7,592,231 B2 | 9/2009 | Cheng |
| 7,608,489 B2 * | 10/2009 | Chidambarrao et al. ..... 438/142 |
| 7,622,341 B2 * | 11/2009 | Chudzik et al. ............ 438/199 |
| 7,667,227 B2 | 2/2010 | Shimamune |
| 7,691,752 B2 | 4/2010 | Ranade |
| 7,745,847 B2 * | 6/2010 | Tseng et al. ............... 257/190 |
| 7,838,370 B2 | 11/2010 | Mehta |
| 8,053,304 B2 * | 11/2011 | Ko ........................... 438/222 |
| 8,168,971 B2 * | 5/2012 | Chidambarrao et al. ..... 257/49 |
| 8,471,342 B1 * | 6/2013 | Flachowsky et al. ........ 257/369 |
| 8,497,528 B2 * | 7/2013 | Lee et al. .................... 257/192 |
| 2002/0135071 A1 | 9/2002 | Kang |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0142537 A1 | 7/2004 | Lee |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0001095 A1 | 1/2006 | Doris |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0197161 A1 | 9/2006 | Takao |
| 2006/0228842 A1 | 10/2006 | Zhang |
| 2006/0231826 A1 | 10/2006 | Kohyama |
| 2006/0258126 A1 | 11/2006 | Shiono |
| 2006/0281245 A1 | 12/2006 | Okuno |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0141852 A1 | 6/2007 | Stapelmann |
| 2007/0166929 A1 | 7/2007 | Matsumoto |
| 2007/0196987 A1 * | 8/2007 | Chidambarrao et al. ..... 438/285 |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0173947 A1 | 7/2008 | Hou |
| 2008/0220579 A1 | 9/2008 | Pal |
| 2008/0233722 A1 | 9/2008 | Liao |
| 2008/0233746 A1 | 9/2008 | Huang |
| 2008/0242020 A1 | 10/2008 | Chen |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0159981 A1 | 6/2009 | Niimi |
| 2009/0166625 A1 | 7/2009 | Ting |
| 2009/0184402 A1 | 7/2009 | Chen |
| 2009/0186475 A1 | 7/2009 | Ting |
| 2009/0230439 A1 | 9/2009 | Wang |
| 2009/0246922 A1 | 10/2009 | Wu |
| 2009/0278170 A1 | 11/2009 | Yang |
| 2009/0289284 A1 | 11/2009 | Goh |
| 2009/0302348 A1 | 12/2009 | Adam |
| 2010/0001317 A1 | 1/2010 | Chen |
| 2010/0093147 A1 | 4/2010 | Liao |
| 2010/0184359 A1 | 7/2010 | Park |
| 2012/0098067 A1 * | 4/2012 | Yin et al. .................... 257/351 |
| 2013/0065371 A1 * | 3/2013 | Wei et al. .................... 438/294 |
| 2013/0153965 A1 * | 6/2013 | Boyanov et al. ............ 257/192 |
| 2013/0221412 A1 * | 8/2013 | Bian et al. .................... 257/255 |

\* cited by examiner

METHOD OF FORMING SEMICONDUCTOR DEVICE

BACKGROUND OF THE INVENTION

1. Field of the Invention

The present invention relates to a method of forming a semiconductor device, and more particularly, to a method of fabricating a semiconductor device having a strained silicon layer.

2. Description of the Prior Art

With the trend of miniaturization of semiconductor device dimensions, the scale of the gate, source and drain of a transistor has decreased in accordance with the decrease in critical dimension (CD). Due to the physical limitation of the materials used, the decrease in scale of the gate, source and drain results in the decrease of carriers which determine the magnitude of the current in the transistor element, and this can adversely affect the performance of the transistor. Accordingly, in order to boost up a metal-oxide-semiconductor (MOS) transistor, increasing carrier mobility is an important consideration in the field of current semiconductor technique.

In the conventional technologies, a strained semiconductor substrate is used to provide biaxial tensile stress for increasing carrier mobility. A silicon-germanium (SiGe) layer is formed on the silicon substrate, and a silicon layer is further formed on the SiGe layer to constitute the strained semiconductor substrate. The lattice constant of silicon (Si) is 5.431 angstroms (A), and the lattice constant of germanium (Ge) is 5.646 A. When the silicon layer is disposed on the SiGe layer, lateral stress is formed in the silicon layer due to the lattice constant difference, so this silicon layer can serve as a strained silicon layer. The strained silicon layer facilitates the formation of a gate dielectric layer of high quality, and provides stress to the channel region of a transistor for enhancing carrier mobility.

The excessive thermal budget from other semiconductor process such as a thermal oxidation process performed during the formation of shallow trench isolations (STI) or an annealing process may cause defects such as dislocations, and even worse, the loss of stress in the strained silicon layer. Consequently, how to prevent side effects induced by these other semiconductor process while maintaining the normal function of the strained silicon layer is an important issue in this field.

SUMMARY OF THE INVENTION

It is therefore one of the objectives of the present invention to provide a method of fabricating a semiconductor device that sustains the stress of the strained silicon layer and improves the reliability of the semiconductor device performance.

An exemplary embodiment of the present invention provides a method for forming a semiconductor device that includes the following steps. First, a semiconductor substrate including a first strained silicon layer is provided. Then, at least an insulating region such as a shallow trench isolation (STI) is formed, where a depth of the insulating region is substantially larger than a depth of the first strained silicon layer. Subsequently, the first strained silicon layer is removed, and a second strained silicon layer is formed.

The formed strained silicon layer is commonly influenced by subsequent semiconductor processes. The heat produced during the STI process is transferred to the neighboring semiconductor substrate and alters the lattice constant of the semiconductor substrate. Accordingly, the stress of the formed strained silicon layer is affected. The present invention utilizes the later formed second strained silicon layer to replace the originally formed first strained silicon layer for ensuring the predetermined stress of the strained silicon layer, and a lattice constant of the second strained silicon layer is preferably the same as a lattice constant of the first strained silicon layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
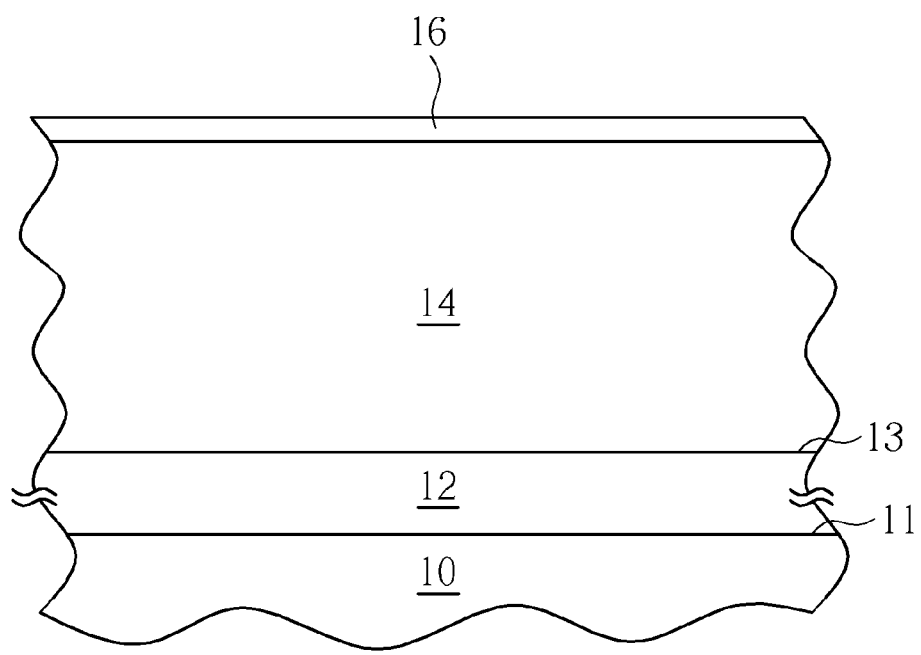
FIG. 1 through FIG. 6 illustrate a method for forming a semiconductor device having a strained silicon layer according to a preferred exemplary embodiment of the present invention.

Please refer to FIG. 1 through FIG. 6, which illustrate a method for forming a semiconductor device having a strained silicon layer according to a preferred exemplary embodiment of the present invention. At first, a semiconductor substrate, at least an epitaxial layer and a strained silicon layer are provided. As shown in FIG. 1, a semiconductor substrate 10 may be a silicon substrate or a silicon on insulator (SOI) substrate, and the semiconductor substrate 10 includes a first epitaxial layer 12, a second epitaxial layer 14 and a first strained silicon layer 16. The first epitaxial layer 12 and the second epitaxial layer 14 are disposed between the semiconductor substrate 10 and the first strained silicon layer 16, and the second epitaxial layer 14 is disposed on the first epitaxial layer 12. The first epitaxial layer 12 and the second epitaxial layer 14 respectively include a silicon-germanium epitaxial layer, where a material of the silicon-germanium epitaxial layer may be denoted as $(Si_{(1-y)}Ge_y)$, but is not limited thereto. For decreasing the surface defects such as dislocation in the first strained silicon layer 16 due to the germanium penetration, in this exemplary embodiment, the first epitaxial layer 12 has a graded germanium concentration distribution. In other words, a mole fraction (y) of germanium in the first epitaxial layer 12 increases progressively from an interface 11 between the semiconductor substrate 10 and the first epitaxial layer 12 towards an interface 13 between the first epitaxial layer 12 and the second epitaxial layer 14. Furthermore, a mole fraction (y) of germanium in the second epitaxial layer 14 is substantially fixed and equal to the mole fraction (y) of germanium at the interface 13 between the first epitaxial layer 12 and the second epitaxial layer 14. In another aspect, a lattice constant of the first epitaxial layer 12 is varied and ranges between a lattice constant of the semiconductor substrate 10 such as a lattice constant of silicon and a lattice constant of the second epitaxial layer 14. A molecule arrangement of a silicon layer refers to a molecule arrangement of the second epitaxial layer 14 underneath the silicon layer. As the lattice constant of the second epitaxial layer 14 such as the lattice constant of silicon-germanium epitaxy is substantially larger than the lattice constant of silicon, the silicon layer disposed on the second epitaxial layer 14 can obtain a lateral stress; accordingly, the silicon layer having biaxial tensile strain can serve as the first strained silicon layer 16.

Figure 2:
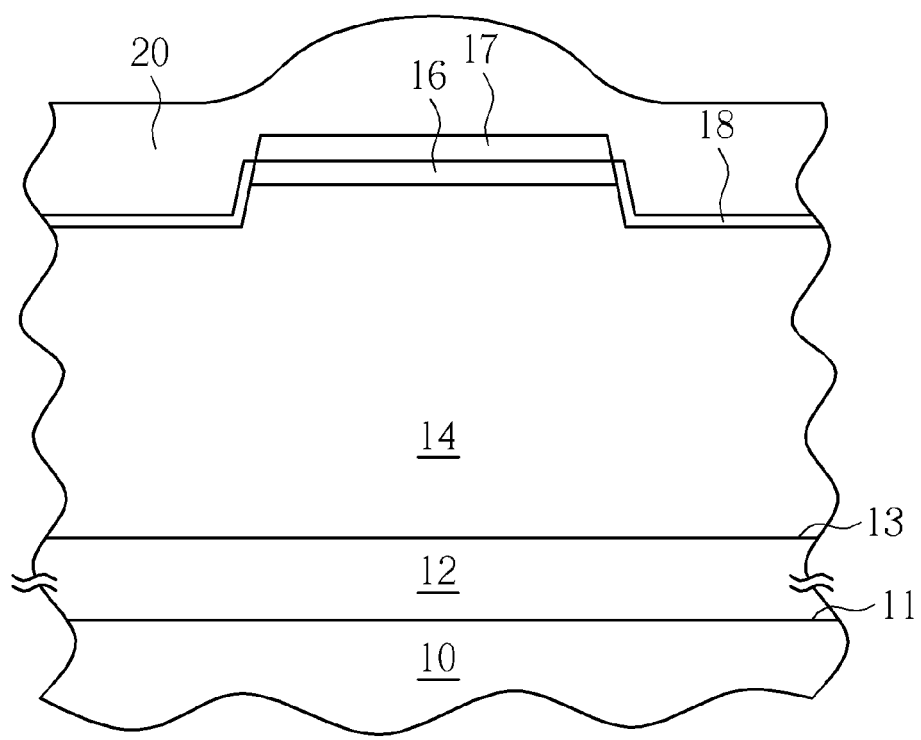
Figure 3:
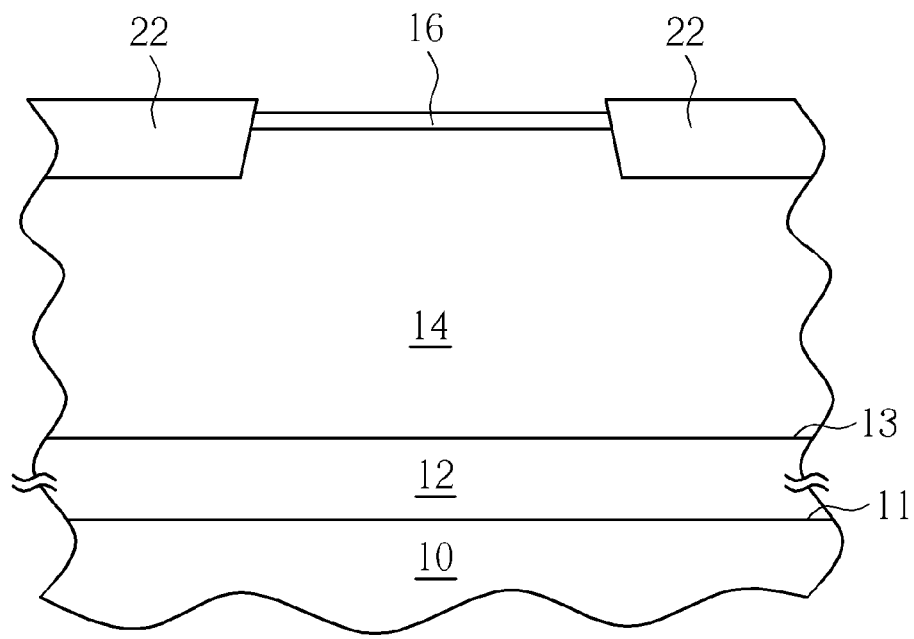

Subsequently, as shown in FIG. 2 and FIG. 3, at least an insulating region is formed in the semiconductor substrate 10, where a depth of the insulating region is substantially larger than a depth of the first strained silicon layer 16, but smaller than a depth of the second epitaxial layer 14. In this exemplary embodiment, the insulating region may be a shallow trench isolation 22 (STI) having a depth of around 3000 angstroms (A). The method of forming the STI 22 includes the following steps. A patterned mask 17 is formed on the semiconductor substrate 10 for defining the location of the STI 22. The material of the patterned mask 17 includes silicon nitride or a combination of silicon oxide and silicon nitride. Then, an etching process is performed to form at least a trench (not shown) in the semiconductor substrate 10. Furthermore, a thermal oxidation process is performed to form an oxide layer 18 covering a bottom and inner sides of the trench, and a dielectric layer 20 which may be made of oxide is formed for filling the trench and overlapping the semiconductor substrate 10 through a chemical vapor deposition (CVD) process including high density plasma density CVD (HDPCVD) process, sub atmosphere CVD (SACVD) process, or spin on dielectric (SOD) process. Moreover, a chemical mechanical polishing (CMP) process is performed for the planarization of the dielectric layer 20 and the top of the patterned mask 17 is exposed. Finally, the patterned mask 17 is removed, and the formation of STI 22 including the oxide layer 18 and the dielectric layer 20 is completed. Please note that the STI process is not limited to the illustrated process.

It should be noted that the heat produced during the STI process will be transferred to the neighboring first strained silicon layer 16 and thereby alter the lattice constant of the first strained silicon layer 16. Accordingly, the stress in the first strained silicon layer 16 may be changed. In other words, after receiving the thermal budget from the thermal oxidation process or the HDPCVD process of the STI process, the stress in the first strained silicon layer 16 may be lost.

Figure 4:
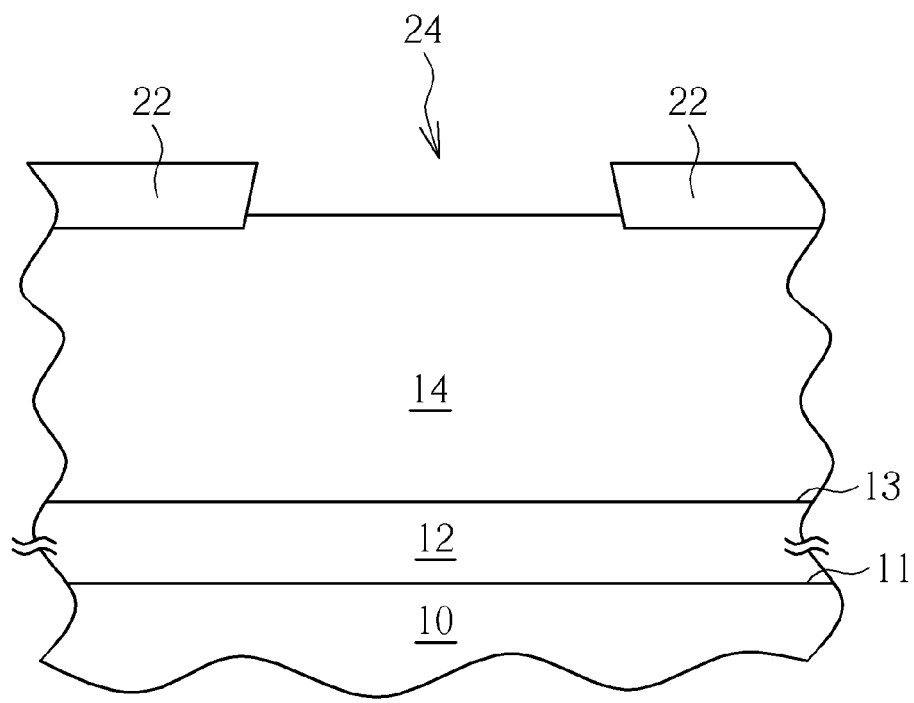

In order to ensure the completeness of the stress in the strained silicon layer, the present invention includes a step of removing the regions where stress is changed or eliminated due to heat. As shown in FIG. 4, the first strained silicon layer 16 and a portion of the second epitaxial layer 14 is removed to form an opening 24. This could be achieved through an etching process including a dry etching process or a wet etching process. For protecting the corner of the insulating region such as the STI 22, the wet etching process having high etching selectivity is preferably used, and the etchant could be selected as diluted ammonia ($NH_4OH$) or tetramethyl ammonium hydroxide (TMAH) solution, but is not limited thereto. In this exemplary embodiment, the wet etching process with the TMAH solution as etchant is performed to remove the first strained silicon layer 16 followed by removing a portion of the second epitaxial layer 14 to form the opening 24. A depth of the opening 24 is preferably larger than a depth of the later formed source/drain region (not shown), but smaller than a depth of the STI 22. Accordingly, the left second epitaxial layer 14 can still surround the bottom of the STI 22, and the complete stress of the channel region between the later formed source/drain region can be guaranteed without the adverse effect of junction leakage. It should be appreciated that a depth of the removed second epitaxial layer 14 is preferably smaller than one fifth of an original depth of the second epitaxial layer 14, and the bottom of the STI 22 should not be exposed by the opening 24, but the present invention is not limited thereto.

Figure 5:
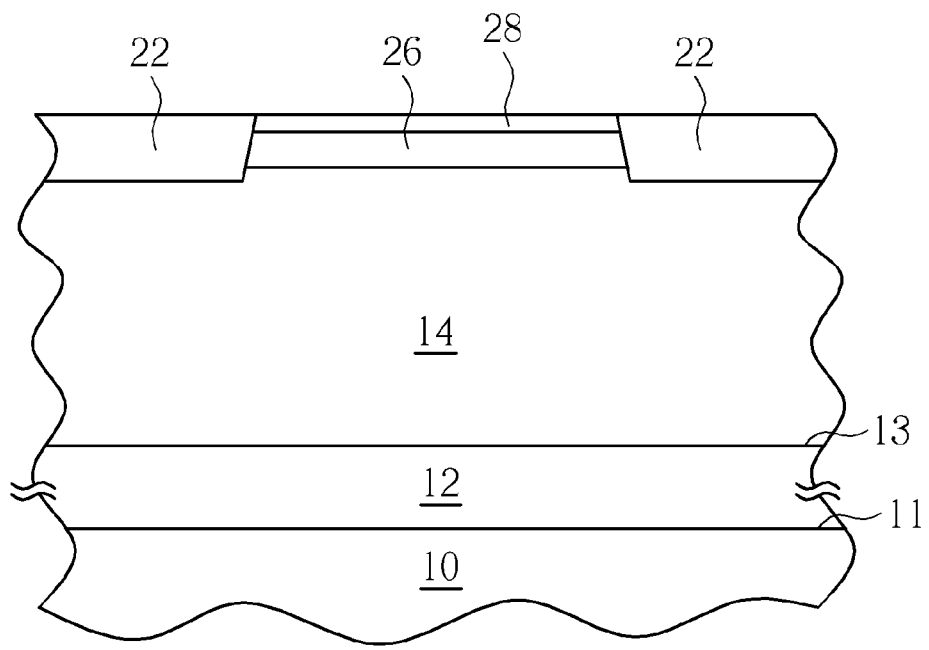

As shown in FIG. 5, a third epitaxial layer 26 is formed on the left second epitaxial layer 14, and a second strained silicon layer 28 is formed on the third epitaxial layer 26 in order. The third epitaxial layer 26 may be a silicon-germanium epitaxial layer, and a material of silicon-germanium epitaxial layer can be denoted as ($Si_{(1-y)}Ge_y$). This could be completed through a selective epitaxial growth (SEG) process. For example, silicon-containing gas and germanium-containing gas flow into the chamber and the third epitaxial layer 26 grows, the germanium-containing gas is turned off when the third epitaxial layer 26 reaches a predetermined height, and the second strained silicon layer 28 is then formed on the third epitaxial layer 26. It is appreciated that, a mole fraction (y) of germanium in the third epitaxial layer 26 is substantially equal to the mole fraction (y) of germanium in the second epitaxial layer 14 as a fixed value, furthermore, the second epitaxial layer 14 and the third epitaxial layer 26 have the same silicon-germanium molecule arrangement. The silicon molecule arrangement of the second strained silicon layer 28 may refer to the silicon-germanium molecule arrangement of the third epitaxial layer 26 underneath the second strained silicon layer 28. The molecule arrangement is in accordance with the lattice constant; accordingly, a lattice constant of the second strained silicon layer 28 is substantially the same as a lattice constant of the third epitaxial layer 26 underneath the second strained silicon layer 28, and the lattice constant of the third epitaxial layer 26 is substantially the same as the lattice constant of the second epitaxial layer 14 underneath the third epitaxial layer 26. Consequently, the newly formed second strained silicon layer 28 and the removed first strained silicon layer 16 can have the same lattice constant as that of the second epitaxial layer 14; that is, the second strained silicon layer 28 is able to provide an identical stress as the first strained silicon layer 16. Therefore, STI 22 and the second strained silicon layer 28 having the complete stress without any impact caused by the formation process of STI 22 are formed in the semiconductor substrate 10 herein.

Figure 6:
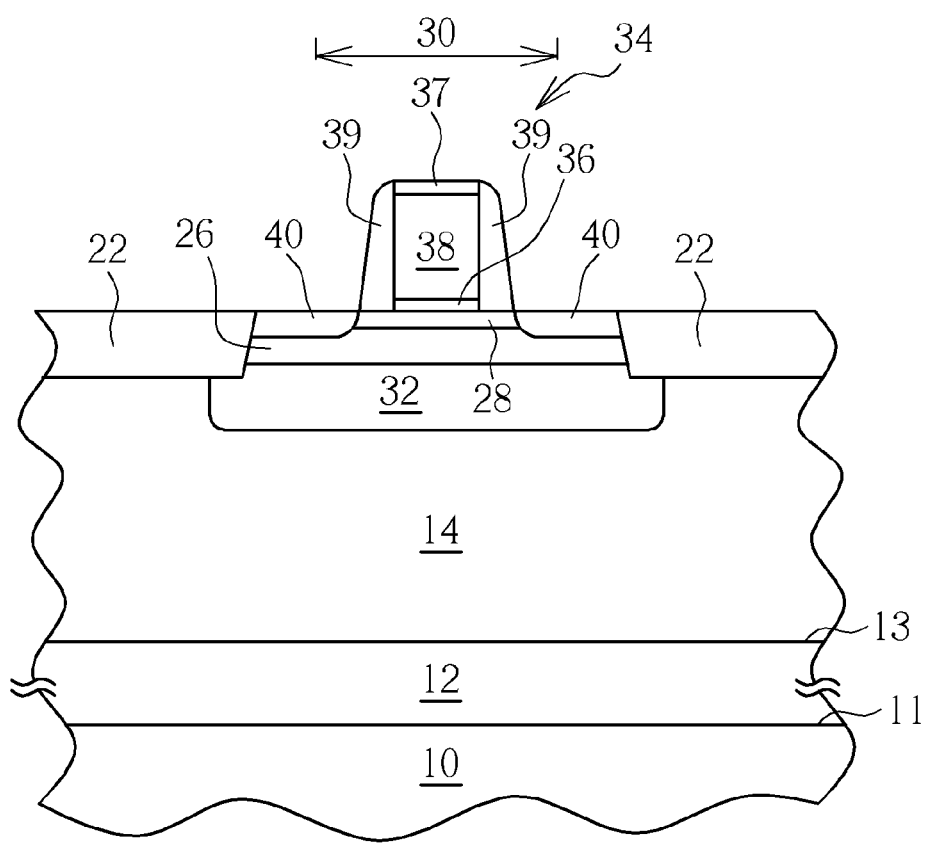

After those processes which may adversely affect the quality of the originally formed strained silicon layer are performed, the present invention removes the originally formed strained silicon layer, and refills the newly formed strained silicon layer for ensuring the complete stress in the strained silicon layer. Additionally, the present invention may be combined with various semiconductor processes to form a MOS transistor. As shown in FIG. 6, at least an active region 30 is defined in the semiconductor substrate 10, and the active region 30 is used to dispose at least a transistor having a specific conductive type. The insulating region such as STI 22 surrounds the active region 30. At least a first well 32 having a first conductive type is formed in the active region 30 by performing a first ion implantation process with the dopants having the first conductive type, where the first conductive type may be n-type or p-type. Subsequently, at least a gate structure 34 is formed on the first well 32, and the gate structure 34 includes a gate dielectric layer 36, a gate conductive layer 38, a cap layer 37 and a spacer 39. The gate dielectric layer 36 could be a low-k (low dielectric constant) gate dielectric layer made of silicon oxide, nitridation silicon oxide or other low-k material, or a high-k gate dielectric layer. The material of the high-k gate dielectric layer may be hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-}$ $_x$O$_3$, PZT), barium strontium titanate (Ba$_x$Sr$_{1-x}$TiO$_3$, BST) or combination thereof. The gate dielectric layer 36 made of silicon oxide can be formed through a thermal oxidation process, chemical vapor deposition (CVD) process, or atomic layer deposition (ALD) process. Furthermore, the gate conductive layer 38 may be made of undoped polysilicon, polysilicon having N+ dopants, or a metal layer having the specific work function. By performing a second ion implantation process with the dopants having the second conductive type, at least a source/drain region 40 having a second conductive type is formed in the first well 32 at two sides of the gate structure 34. The second conductive type may be p-type or n-type, and the first conductive type is different from the second conductive type.

It should be appreciated that a depth of the source/drain region 40 is substantially larger or equal to a depth of the second strained silicon layer 28 for ensuring the predetermined stress provided to the channel region. Consequently, a transistor having the second conductive type is formed in the semiconductor substrate of the first well 32 having the first conductive type. It is also feasible to combine the present invention with various metal gate processes such as the high-k last process integrated into the gate-last process. That is, after the formation of the gate structure 34 having channel region in the second strained silicon layer 28, an opening is formed between the spacer 39 by removing the gate dielectric layer 36, the gate conductive layer 38 and the cap layer 37 of the gate structure 34, and a high-k gate dielectric layer and a corresponding metal gate conductive layer are further formed to fill the opening for forming a metal gate structure.

In conclusion, the formed strained silicon layer is commonly influenced by subsequent semiconductor processes; for example, the heat produced during the STI process is transferred to the neighboring semiconductor substrate and alters the lattice constant of the semiconductor substrate. Accordingly, the stress of the formed strained silicon layer is affected. For this reason, after the STI process, the present invention utilizes the later formed second strained silicon layer to replace the originally formed first strained silicon layer for ensuring the predetermined stress of the strained silicon layer, and a lattice constant of the second strained silicon layer is preferably the same as a lattice constant of the first strained silicon layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a semiconductor substrate comprising a first strained silicon layer;
   forming at least an insulating region, wherein a depth of the insulating region is substantially larger than a depth of the first strained silicon layer;
   removing the first strained silicon layer; and
   forming a second strained silicon layer.

2. The method for forming a semiconductor device according to claim 1, wherein the insulating region comprises a shallow trench isolation (STI).

3. The method for forming a semiconductor device according to claim 2, wherein the method for forming the shallow trench isolation comprises:
   forming a patterned mask on the semiconductor substrate;
   performing an etching process for forming at least a trench;
   performing a thermal oxidation process for forming an oxide layer covering a bottom and inner sides of the trench;
   forming a dielectric layer made of oxide for filling the trench; and
   performing a chemical mechanical polishing (CMP) process.

4. The method for forming a semiconductor device according to claim 1, wherein the semiconductor substrate comprises a first epitaxial layer and a second epitaxial layer disposed between the semiconductor substrate and the first strained silicon layer, the second epitaxial layer is disposed on the first epitaxial layer, and a depth of the second epitaxial layer is substantially larger than the depth of the insulating region.

5. The method for forming a semiconductor device according to claim 4, wherein a portion of the second epitaxial layer is removed, as the first strained silicon layer is removed.

6. The method for forming a semiconductor device according to claim 5, wherein the left second epitaxial layer surrounds a bottom of the insulating region.

7. The method for forming a semiconductor device according to claim 5, wherein after removing a portion of the second epitaxial layer, and before forming the second strained silicon layer, a third epitaxial layer is formed on the left second epitaxial layer.

8. The method for forming a semiconductor device according to claim 7, wherein the first epitaxial layer, the second epitaxial layer and the third epitaxial layer respectively comprise a silicon-germanium epitaxial layer.

9. The method for forming a semiconductor device according to claim 8, wherein a material of silicon-germanium epitaxial layer is denoted as (Si$_{(1-y)}$Ge$_y$).

10. The method for forming a semiconductor device according to claim 9, wherein a mole fraction (y) of germanium in the first epitaxial layer increases progressively from an interface between the semiconductor substrate and the first epitaxial layer towards an interface between the first epitaxial layer and the second epitaxial layer.

11. The method for forming a semiconductor device according to claim 10, wherein a mole fraction (y) of germanium in the second epitaxial layer and a mole fraction (y) of germanium in the third epitaxial layer are substantially fixed and equal to the mole fraction (y) of germanium at the interface between the first epitaxial layer and the second epitaxial layer.

12. The method for forming a semiconductor device according to claim 1, further comprising:
   defining at least an active region in the semiconductor substrate, wherein the insulating region surrounds the active region;
   forming at least a first well having a first conductive type in the active region;
   forming at least a gate structure on the first well; and
   forming at least a source/drain region having a second conductive type in the semiconductor substrate at two sides of the gate structure.

13. The method for forming a semiconductor device according to claim 12, wherein the first conductive type comprises n-type or p-type, the second conductive type comprises p-type or n-type, and the first conductive type is different from the second conductive type.

14. The method for forming a semiconductor device according to claim 12, wherein the gate structure comprises a gate dielectric layer, a gate conductive layer, a cap layer and a spacer.

15. The method for forming a semiconductor device according to claim 14, wherein the gate dielectric layer comprises a low-k (low dielectric constant) gate dielectric layer or a high-k gate dielectric layer.

* * * * *